(12) United States Patent
Engel et al.

(10) Patent No.: US 9,961,787 B1
(45) Date of Patent: *May 1, 2018

(54) MULTI-STANDARD INSTRUMENTATION CHASSIS

(71) Applicants: Advanced Testing Technologies, Inc., Hauppauge, NY (US); Eli Levi, Dix Hills, NY (US)

(72) Inventors: Richard Engel, Ridge, NY (US); Eli Levi, Dix Hills, NY (US); Robert Spinner, East Northport, NY (US); Thomas Leddy, Eastport, NY (US)

(73) Assignee: Advanced Testing Technologies, Inc., Hauppauge, NY (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/259,994

(22) Filed: Sep. 8, 2016

Related U.S. Application Data

(63) Continuation of application No. 14/695,106, filed on Apr. 24, 2015, now Pat. No. 9,488,673, which is a continuation-in-part of application No. 14/487,851, filed on Sep. 16, 2014, now Pat. No. 9,295,169.

(60) Provisional application No. 61/902,475, filed on Nov. 11, 2013, provisional application No. 61/878,112, filed on Sep. 16, 2013.

(51) Int. Cl.
*G01R 31/28* (2006.01)
*H05K 5/00* (2006.01)
*H01R 13/73* (2006.01)
*H05K 7/14* (2006.01)

(52) U.S. Cl.
CPC ....... *H05K 5/0065* (2013.01); *G01R 31/2834* (2013.01); *H01R 13/73* (2013.01); *H05K 7/1447* (2013.01)

(58) Field of Classification Search
USPC ........................ 324/73.1, 538, 539, 555, 511
See application file for complete search history.

(56) References Cited

U.S. PATENT DOCUMENTS

| | | |
|---|---|---|
| 4,486,816 A | 12/1984 | Hope |
| 5,001,422 A | 3/1991 | Dahlberg et al. |
| 5,237,484 A | 8/1993 | Ferchau et al. |
| 5,268,837 A | 12/1993 | Liken et al. |
| 5,600,788 A | 2/1997 | Lofgren et al. |
| 5,794,175 A | 8/1998 | Conner |
| 5,896,473 A | 4/1999 | Kaspari |
| 5,986,447 A | 11/1999 | Hanners et al. |

(Continued)

FOREIGN PATENT DOCUMENTS

CA            2354181 A1     1/2003

*Primary Examiner* — Vincent Q Nguyen
(74) *Attorney, Agent, or Firm* — Brian Roffe

(57) ABSTRACT

Chassis for an automated test system including a housing and at least a first and a second backplane in the housing. The first backplane provides electrical connections for at least one functional module of a first type when engaged with the first backplane, while the second backplane provides electrical connections for at least one functional module of a second type different than the first type when engaged with the second backplane. The first and second backplanes include electrical circuitry to enable signals to be provided for the functional modules when engaged therewith. A bottom of the housing includes ducts to enable cooling of both types of functional modules when engaged with the housing.

20 Claims, 3 Drawing Sheets

(56) References Cited

U.S. PATENT DOCUMENTS

| | | |
|---|---|---|
| 5,986,458 A | 11/1999 | Saito et al. |
| 5,989,037 A | 11/1999 | Ruque |
| 5,991,163 A | 11/1999 | Marconi et al. |
| 6,163,464 A | 12/2000 | Ishibashi et al. |
| 6,249,441 B1 | 6/2001 | Barbier et al. |
| 6,349,037 B1 | 2/2002 | Draughn et al. |
| 6,358,095 B1 | 3/2002 | Rootz et al. |
| 6,462,532 B1 | 10/2002 | Smith |
| 6,505,281 B1 | 1/2003 | Sherry |
| 6,597,566 B1 | 7/2003 | Phan |
| 6,640,273 B1 | 10/2003 | Spisak et al. |
| 6,643,798 B2 | 11/2003 | Barton et al. |
| 6,662,255 B1 | 12/2003 | Klein |
| 6,700,396 B1 | 3/2004 | Smith et al. |
| 6,757,177 B2 | 6/2004 | Harris et al. |
| 6,956,379 B2 | 10/2005 | Mastoris et al. |
| 6,975,130 B2 | 12/2005 | Yevmeneko |
| 6,981,086 B2 | 12/2005 | Wetzel et al. |
| 6,989,902 B2 | 1/2006 | Maiaender et al. |
| 6,995,578 B2 | 2/2006 | Shibuya et al. |
| 7,075,796 B1 | 7/2006 | Pritchett |
| 7,092,253 B2 | 8/2006 | Lam |
| 7,138,733 B2 | 11/2006 | Sanders et al. |
| 7,149,093 B2 | 12/2006 | Conway |
| 7,212,412 B2 | 5/2007 | Carlson et al. |
| 7,242,590 B1 | 7/2007 | Yeap et al. |
| 7,254,025 B2 | 8/2007 | Baldwin, Jr. |
| 7,272,774 B2 | 9/2007 | Co et al. |
| 7,331,794 B2 | 2/2008 | Imbert et al. |
| 7,348,786 B2 | 3/2008 | Thacker et al. |
| 7,355,850 B2 | 4/2008 | Baldwin, Jr. |
| 7,362,089 B2 | 4/2008 | Kushnick et al. |
| 7,576,997 B2 | 8/2009 | Brolin et al. |
| 7,780,455 B2 | 8/2010 | Leigh et al. |
| 8,040,192 B2 | 10/2011 | Maeda et al. |
| 8,138,778 B1 | 3/2012 | Smith |
| 8,446,722 B2 | 5/2013 | Fowler |
| 8,456,857 B2 | 6/2013 | Groeschner et al. |
| 8,656,229 B2 | 2/2014 | Elserougi et al. |
| 9,723,727 B2 | 8/2017 | Lam |
| 2001/0030789 A1* | 10/2001 | Jiang .................... G02B 6/4201 398/164 |
| 2002/0090844 A1 | 7/2002 | Kocin |
| 2002/0131257 A1 | 9/2002 | Agard |
| 2004/0201956 A1 | 10/2004 | Conway |
| 2006/0090100 A1 | 4/2006 | Holzapfel et al. |
| 2006/0109636 A1 | 5/2006 | Hood, III et al. |
| 2007/0291905 A1 | 12/2007 | Halliday et al. |
| 2009/0106761 A1 | 4/2009 | Chandhoke |
| 2009/0219702 A1 | 9/2009 | Mazura et al. |
| 2010/0079151 A1 | 4/2010 | Nordstrom et al. |
| 2010/0199011 A1 | 8/2010 | Chen et al. |
| 2011/0255574 A1 | 10/2011 | Carter et al. |
| 2012/0113603 A1 | 5/2012 | Tokunaga |
| 2013/0050171 A1 | 2/2013 | Tsai |
| 2013/0201278 A1 | 8/2013 | Chang |
| 2013/0329392 A1 | 12/2013 | Czuba et al. |
| 2014/0365698 A1 | 12/2014 | Richard et al. |

* cited by examiner

MULTI-STANDARD INSTRUMENTATION CHASSIS

CROSS-REFERENCE TO RELATED APPLICATIONS

This application is a continuation of U.S. patent application Ser. No. 14/695,106 filed Apr. 24, 2015, which is a continuation-in-part of U.S. patent application Ser. No. 14/487,851 filed Sep. 16, 2014, now U.S. Pat. No. 9,295,169, which claims priority under 35 U.S.C. § 119(e) of U.S. provisional patent application Ser. Nos. 61/878,112 filed Sep. 16, 2013, and 61/902,475 filed Nov. 11, 2013, all of which are incorporated by reference herein.

FIELD OF THE INVENTION

The present invention relates generally to automated test systems that utilize modular instrumentation that is intended to be housed within a standardized chassis.

BACKGROUND OF THE INVENTION

The evolution of test instrumentation has transitioned over the years from a situation where a single stand-alone box that would typically provide a single dedicated function to one where a multitude of standardized chassis now have the ability to house a plurality of modules, with each module providing a dedicated function so that with a single chassis, multiple functions can be provided.

Bulky test stations for testing complex pieces of equipment using a rack-and-stack approach have largely morphed into significantly smaller footprints through the use of the modular instrumentation. Rack-and-stack implementations may still be used where instrumentation dictates a stand-alone unit (i.e., a display) but over time, even units requiring displays have also gone 'faceless' to reduce complexity. The benefits of a modular approach are readily apparent, including for example, redundant functions (control, cooling, power) are eliminated which in turn results in a reduction of size and an increase in overall station reliability.

Over the past 30 years or more, a number of standardized chassis have been implemented including, but not limited to: MMS, Eurocard, VERSAbus, VMEbus, VXI, VPX, PCI, PXI and AXIe to name a few (the full terms of these abbreviations are known to those skilled in the art to which this invention pertains). While the modular approach has many benefits, one drawback is most systems typically have unused chassis space. Some systems intentionally allocate unused space for future expansion while in other systems it is simply the result of how the system was populated. Over time, as existing instrumentation is deemed obsolete by the original equipment manufacturers (OEMs), it is often replaced by a different (or even a newer) modular form factor which might not be currently implemented within a test station.

OBJECTS AND SUMMARY OF THE INVENTION

An object of at least one embodiment of the present invention is to provide a chassis that is capable of supporting a plurality of instrumentation form factors.

A chassis for an automated test system in accordance with the invention includes a housing, and at least a first and a second backplane in the housing. The first backplane provides electrical connections for at least one functional module of a first type when engaged therewith, and the second backplane provides electrical connections for at least one functional module of a second type different than the first type when engaged therewith. The first and second backplanes include electrical circuitry to enable signals to be provided for the functional modules when engaged therewith. Thus, two different backplanes are positioned in the same housing.

In other embodiments, each of the first and second backplanes includes a respective controller. The first and second backplanes may each be configured to source all voltages required by the functional modules engaging therewith. As an example of backplanes, the first backplane may be a VXI backplane while the second backplane is a PXI backplane.

A respective securing arrangement may be provided to secure each of the first and second types of functional modules to the housing. A common DC power source may be installed in the housing to provide power through the circuitry to both types of functional modules when engaged with the housing. The circuitry may be configured to allow for trigger signals to pass between the first and second types of functional modules when engaged with the housing. Additionally or alternatively, the circuitry may be configured to allow for clock signals to pass between the first and second types of functional modules when engaged with the housing in a user-controllable or user-selectable manner. Additionally or alternatively, the circuitry may be configured to provide signal conditioning or level translation of auxiliary signals passing between the first and second types of functional modules when engaged with the housing in a user-controllable or user-selectable manner.

A bottom of the housing may include ducts to enable cooling of both types of functional modules when engaged with the housing. Shielding is optionally installed between the first and second backplanes. Potentially, at least one of the first and second backplanes consists of a single printed circuit board. However, at least one of the first and second backplanes may include a plurality of printed circuit boards.

A method for designing a chassis that supports different functional modules in accordance with the invention includes determining parameters of a largest one of the modules to be supported by the chassis, configuring a housing of the chassis with respective backplane for each of a plurality of different types of module to enable the housing to support at least one of each type of module, each backplane including electrical circuitry to enable signals to be provided for the modules when engaged therewith, determining required supply voltages of the modules, and configuring the housing to provide at least one of the required supply voltages for each of the modules through the respective backplane. The method also includes arranging a controller for each type of module on the housing, and coupling the controller for each type of module to electrical connectors on the housing that engage with that type of module.

Variations to the method which may be implemented individually or in combinations with one another include providing power to the backplanes from a common source through the circuitry to both types of modules when supported by the housing, sourcing a clock signal for the modules when supported by the housing from a clock source on the backplane for a first type of modules, or a clock source on the backplane for a second type of modules, and interposing shielding between the backplanes to reduce signal interference.

Another embodiment of a chassis for an automated test system in accordance with the invention includes a housing, and a plurality of different backplanes in the housing all oriented in a common axis and situated alongside one another. Each backplane includes electrical connectors for a plurality of one distinct type of functional modules when engaged with the connectors. Also, each backplane includes electrical circuitry to enable signals to be provided simultaneously for all of the functional modules when engaged with the connectors. A cooling system may be configured to satisfy cooling requirements of the different types of functional modules when engaged with the connectors. The backplanes also include common signal lines additional to a minimum number of signal lines needed to support all of the functional modules, and each of the backplanes is configured to provide an address bus, a data bus, a trigger bus, an interrupt bus, a local bus, clock and power signals and slot identification signals and to source all voltages required by the functional modules.

The invention will be described in detail with reference to some preferred embodiments of the invention illustrated in the figures in the accompanying drawings. However, the invention is not confined to the illustrated and described embodiments alone.

BRIEF DESCRIPTION OF THE DRAWINGS

Additional objects of the invention will be apparent from the following description of the preferred embodiment thereof taken in conjunction with the accompanying non-limiting drawings, in which.

DETAILED DESCRIPTION OF THE INVENTION

Figure 1:
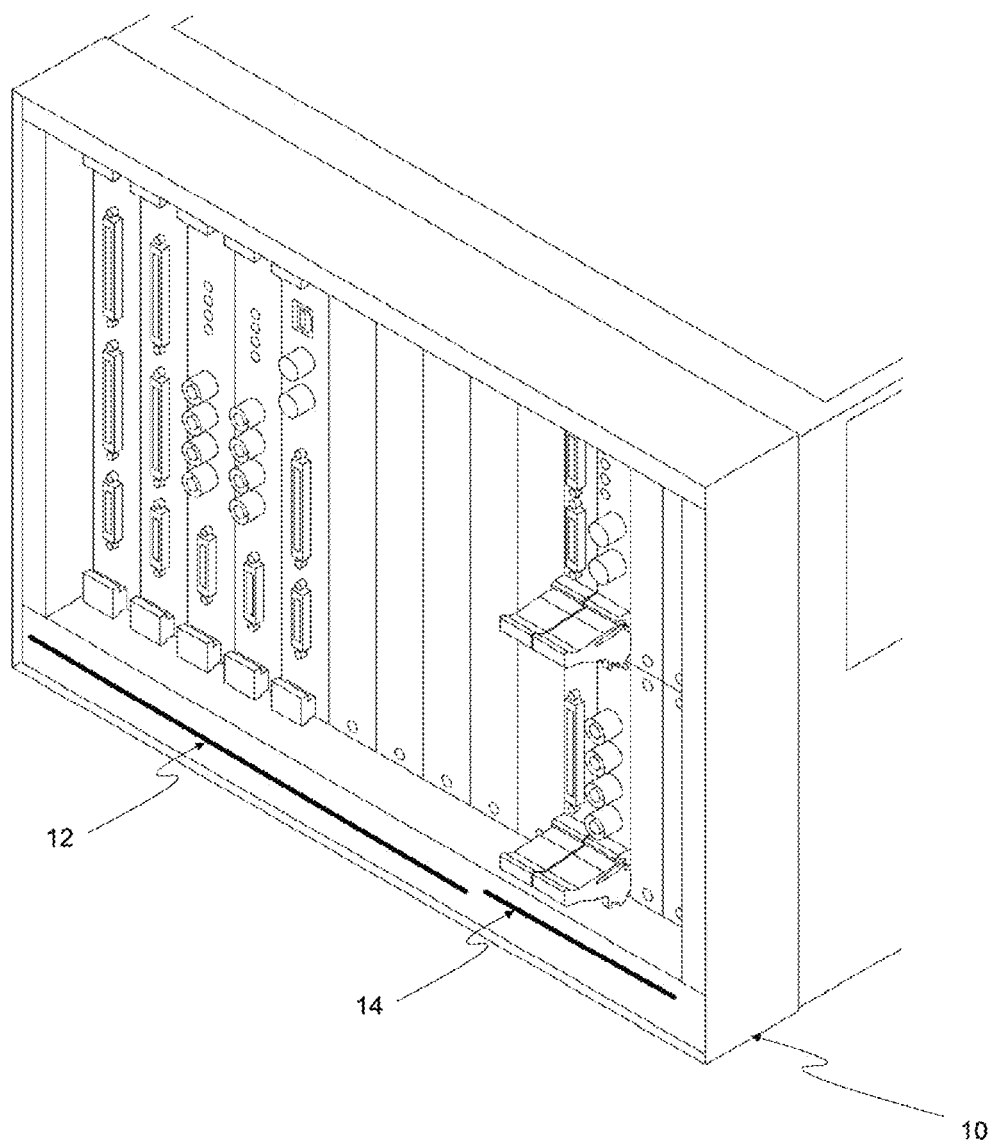
FIG. 1 shows the physical implementation of a chassis which supports both VXI instrumentation as well as 3U/6U PXI instrumentation within the same structure.

In an effort to make the most of unused instrumentation space, a primary intent of this invention is to implement a chassis for test instrumentation which allows a plurality of different module types of dissimilar instrumentation standards to reside within the same chassis housing. To enumerate each and every chassis permutation ad nauseam serves no practical purpose, so for the sake of clarity and convenience, the descriptions herein will be limited to VXI (C-Size) and PXI modules due to their ubiquitous presence throughout the test instrumentation industry. The invention is in no way constrained to using only these instrumentation form factors/standards and those skilled in the art could readily adapt a chassis to other current and future instrumentation standards to house different module types/configurations, in view of the teachings disclosed herein. Moreover, the invention is in no way limited to a chassis for test instrumentation or instruments, although this is a preferred implementation.

Preferred embodiments of the invention will be described with reference to FIGS. 1-3 wherein like reference numerals refer to the same or similar elements. In order to implement a chassis that supports multiple instrumentation standards, one must first look at the physical module sizes that are needed within the system to support. In terms of physical sizes, the larger dimension (height, width, depth) of the desired modules will be the determining factor as to how the chassis is implemented and essentially dictate the overall size of the chassis. In the case of the aforementioned C-Size VXI and PXI modules, both are based on the 6U Eurocard standard, both utilize common power supply voltages and both utilize bottom entry vertical airflow cooling. These similarities result in ideal conditions for a chassis that supports both types of modules. In the case of PXI modules, they are available in both 3U (much more prevalent) and 6U variants—one or more of the embodiments of the proposed invention would be capable of supporting both types.

The rendering shown in FIG. 1 reflects a dual standard chassis 10 having both C-Size VXI slots 12 and 3U/6U PXI slots 14 implemented within the same housing. In the embodiment depicted, five (5) VXI slots 12 are populated with instrumentation and four (4) 3U PXI slots 14 are populated with instrumentation. In order to maximize the number of PXI slots 14 without having to implement a hardware bridge, a preferred 19" wide rack-mount chassis embodiment would house (10) C-Size VXI slots 12 and four (4) 6U PXI slots 14. Alternate embodiments may utilize a different number of slots 12, 14 for either instrumentation standard or may implement additional or other standards as well. Since both VXI and PXI chassis utilize a number of common power supply voltages (+5 VDC, +12 VDC, −12 VDC), the power supply requirements are reduced. VXI chassis also utilize −5.2 VDC, +24 VDC, −24 VDC and −2 VDC supplies while PXI chassis utilize +3.3 VDC. One or more embodiments of the proposed invention would implement all of these supply voltages in order to support both the requirements of VXI and PXI instrumentation. Other embodiments may implement only a subset of the supply voltages. Each portion of the chassis (VXI or PXI) would generally require its own dedicated controller. Remaining components of the chassis 10 may be the same as those in prior art chassis or readily ascertainable by those skilled in the art to which this invention pertains in view of the disclosure herein, unless otherwise disclosed herein.

Figure 2:
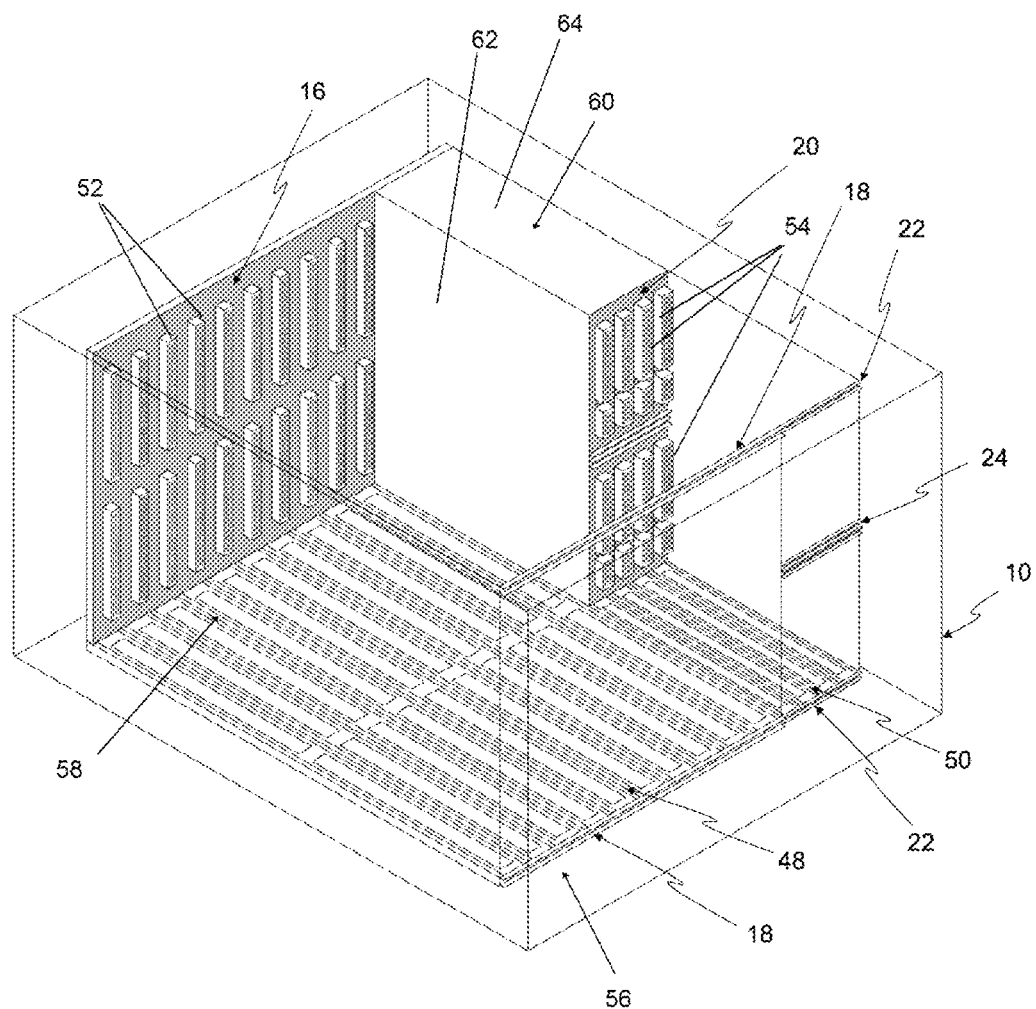
FIG. 2 is a perspective view showing the mechanical and backplane layout of the chassis.

FIG. 2 reflects the implementation of a multi-standard instrumentation chassis. In the preferred embodiment shown, a VXI backplane 16 and a 6U PXI backplane 20 both occupy the rear of the chassis 10, although at different depths. Specifically, the PXI backplane 20 is forward of the VXI backplane 16, i.e., closer to the open end of the chassis 10.

The backplane 20 obtains this smaller depth by means of one or more supports or walls that extend beyond the larger depth backplane, i.e., backplane 16. The supports or walls might be considered to define a housing for supporting circuitry for the backplane 20 or at least a support structure to position and stably support the connectors of the backplane 20, or the backplane 20 itself, a distance in front of the backplane 16 in which they can receive the functional modules that engage therewith (see FIG. 2). The specific length of the supports or walls in the direction of insertion of the functional modules, i.e., the direction from right to left in FIG. 2 through the opening of the chassis 10 into the interior chassis space, that engage with backplane 20 may be dimensioned to provide for insertion of the functional modules a distance to engage with connectors of backplane 20 that results in their front ends being in the same or substantially the same plane as the other functional modules being inserted into the backplane 16 (see FIG. 1 which shows the functional modules in their inserted condition).

Both of the backplanes 16, 20 are oriented in a common axis, i.e., they are adapted to receive functional modules when inserted from the right side in the orientation illustrated, and that would be urged toward the left into engagement with connectors 52, 54 on the backplanes 16, 20, respectively. Thus, the backplanes 16, 20 each include an engagement side (facing the right in FIG. 2) on which the module-engaging portion of each electrical connector 52, 54 is arranged and the engagement sides of the backplanes 16, 20 face the opening 56 into the interior chassis space 58 such that the module-engaging portions of electrical connectors 52, 54 of the backplanes 16, 20, respectively, are oriented toward the opening 56 and the functional modules are insertable through the opening 56 into engagement with the electrical connectors 52, 54 on the engagement side of each backplane 16, 20. Often, the housing of the chassis 10 would include such an opening 56 to allow for insertion of the functional modules into engagement with the connectors 52, 54 on the backplanes 16, 20. It is possible that the shallower backplane, i.e., the PXI backplane 20 in this case, would be attached to the substrate defining the deeper backplane, i.e., the VXI backplane 16 in this case (as shown in FIG. 2). Alternatively, the rear of the shallower backplane may rest against in contact with or just alongside the substrate defining the deeper backplane.

As for additional details about the supports or walls, as shown in FIG. 2, an exemplifying support 60 (also referred to as a support structure) supports the backplane 20 a distance in front of and along one lateral edge of the backplane 16 such that the backplane 20 is supported at a depth into an interior chassis space 58 in the insertion direction which is smaller than a depth of the backplane 16 into the interior chassis space 58 in the insertion direction to cause the electrical connectors 54 on the engagement side of the backplane 20 to be closer to the opening 56 than the electrical connectors 52 on the engagement side of the backplane 16. All of the electrical connectors on the engagement side of both of the backplanes 16, 20 are exposed to the opening 56 simultaneously. The support structure 60 includes a vertical support wall 62 that extends beyond and possibly from the backplane 16 in a direction toward the opening 56.

The support wall 62 is interposed between the backplanes 16, 20 such that all of the electrical connectors 52 of the backplane 16 are situated on one side of the support wall 62 (the left side in FIG. 2) and all of the electrical connectors 54 of the backplane 20 are situated on an opposite side of the support wall 62 (the right side in FIG. 2). The support wall 62 may have a common height with the backplane 16 as shown in FIG. 2. A horizontal wall 64 may also be part of the support structure 60 and defines in part the housing for electrical circuitry associated with the backplane 20.

Support wall 62 thus extends beyond backplane 16 and separates backplane 16 from backplane 20, as part of support structure 60 to allow for support of two (or more) backplanes at different depths. An important aspect is that the same support wall 62 serves two purposes, namely, it separates one backplane from another and also causes, as part of a support structure, one backplane to be at a different depth than the other backplane.

Each of the backplanes 16, 20 could be implemented as a single printed circuit board or as multiple printed circuit boards. A backplane or "backplane system" generally is considered a group of electrical connectors in parallel with each other, so that each pin of each connector is linked to the same relative pin of all the other connectors forming a computer bus. It is typically used as a backbone to connect several printed circuit boards together to make up a complete computer system.

Upper and lower extrusions 18 along with card guides 48 permit a plurality of VXI modules (not shown in FIG. 2) to be secured and retained within the chassis 10 in engagement with the VXI backplane 16. The extrusions 18 and card guides 48 may be considered an example of a securing arrangement that secures the VXI modules to the chassis 10. Similarly, upper and lower extrusions 22 along with card guides 50 permit a plurality of PXI modules (not shown in FIG. 2) to be secured and retained within the same chassis 10, and in engagement with the PXI backplane 20. The extrusions 18, 22 and card guides 48, 50 may be considered an example of a securing arrangement that secures the PXI modules to the chassis 10. The extrusions 18 and card guides 48 may be formed as an integral unit, and the extrusions 22 and card guides 50 may be formed as an integral unit. Also, the extrusions 18, 22 and card guides 48, 50 may be formed as an integral unit. Extrusions 18, 22 and card guides 48, 50 may be formed in a conventional manner of metalworking, and readily derivable to those skilled in the art to which this invention pertains from the disclosure herein.

In a preferred embodiment, a removable divider 24 can be installed within the PXI segment, or portion thereof, to allow the use of 3U PXI cards and/or 6U PXI within the multi-standard instrumentation chassis 10. Since airflow cooling for both VXI and PXI modules originates from the bottom of the chassis 10, ducting the airflow for the difference in module depth between the VXI and PXI standards becomes a rather trivial matter readily achievable by one skilled in the art to which this invention pertains in view of the disclosure herein.

In terms of electrical compatibility, a primary intent of the invention is to generally isolate the signals present within one backplane 16, 20 from those within the other backplane (s) 16, 20 to prevent unnecessary noise, signal crosstalk and commingling of signals. Specifically, address and data buses between instrumentation standards/form factors must ideally remain isolated from one another in order to avoid contention between control functions of each instrumentation standard. A preferred embodiment implements shielding in the area where backplane edges are in close proximity to further reduce interaction or interference between the signals of one backplane 16, 20 on one or more of the other backplanes 16, 20. In instances where it might be possible to combine multiple instrumentation standards onto a single backplane, each instrumentation standard shall ideally remain isolated from the other standard(s) and implement shielding wherever necessary.

Figure 3:
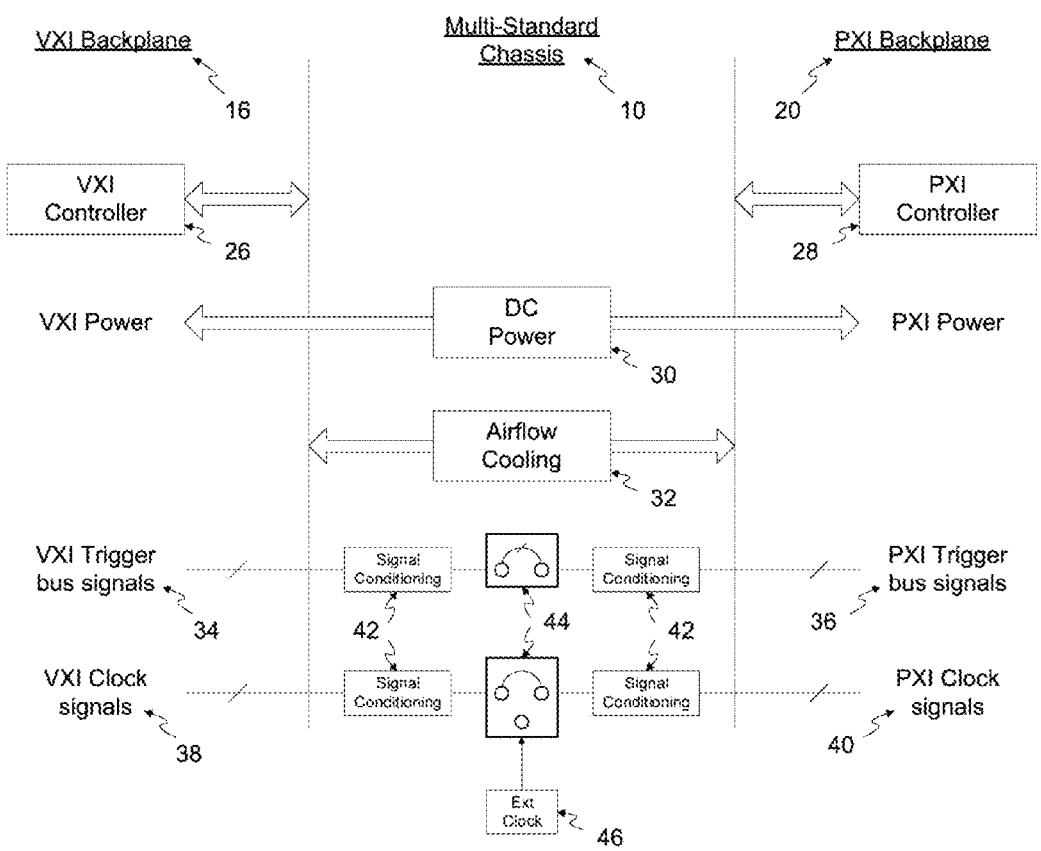
FIG. 3 is a schematic showing how signal interaction is configured between the different instrumentation types supported by the chassis in an embodiment of the present invention.

As shown in FIG. 3, each chassis standard would generally be populated with its own dedicated controller for controlling the backplane, namely controller 26 as a VXI controller and controller 28 as a PXI controller. This not only allows the use of specific controllers as needs dictate, but also minimizes compatibility issues as controllers known to work with a certain configuration can be maintained. As discussed earlier, the DC power sources system 30 and cooling airflow arrangement 32 would be shared amongst the different instrumentation standards.

There are instances where it might prove beneficial to allow limited interaction between the instrumentation standard backplanes 16, 20 within the multi-standard instrumentation chassis 10. In a preferred embodiment, the user would be able to configure/select one or more trigger bus signals (represented at 34, 36) to pass between the VXI and PXI backplanes 16, 20. These trigger signals may flow in a specific direction (i.e., VXI backplane 16 to PXI backplane 20 or PXI backplane 20 to VXI backplane 16) or be bi-directional (flows back and forth between VXI and PXI backplanes 16, 20) as required by customer application. Some signals or embodiments for other chassis standards/ form factors may need to implement active circuitry 42, 44 to perform signal conditioning and/or level translation to insure compatibility between the signals of the instrumentation standards to be used. The signal conditioning and/or level translation is effected by circuitry 42, 44 on auxiliary signals passing between the VXI backplane 16 and the PXI backplane 20 during operation when they have VXI or PXI modules engaged therewith.

This circuitry 42, 44 may be user-controllable or user-selectable. As such, there may be limited interaction of auxiliary signals (i.e., trigger and/or clock signals) between the VXI backplane 16 and the PXI backplane 20 via user selectable means.

For certain applications, synchronized clock distribution between the different instrumentation standards may be desired. A clock might be sourced from the VXI backplane 16 (represented by VXI clock signals 38), PXI backplane 20 (represented by PXI clock signals 40) or from an external source 46. In a preferred embodiment, the user would be able to configure/select the clock source 38, 40, 46 for the various instrumentation backplane(s) implemented within the multi-standard instrumentation chassis 10. One preferred embodiment would utilize active clock distribution techniques to insure high isolation/buffering between backplanes 16, 20 and may optionally include clock multiplier/divider circuitry to allow clocks of different frequencies to be used while maintaining coherency. Alternative embodiments that do not require high isolation may use simpler passive or active circuits for sourcing these clock signals.

With the structure described above, the invention allows for specific advantages to be obtained, including configuring a common chassis that is capable of supporting a plurality of instrumentation form factors.

Use of the chassis would involve insertion of one or more of the mating modules into the chassis, and more specifically, into engagement with a respective one of the connectors of one or both of the backplanes. It is possible to use the chassis with only one type of functional modules, i.e., one or more functional modules of one type would be connected to the same backplane, or with two types of functional modules, i.e., at least one of a first type would be connected to a respective connector of the first backplane and at least one other, different type module would be connected to a respective connector of the other backplane. Once connected, the combined chassis and functional module(s) would be used in the usual manner in which a test station with one or more functional modules is used, and a variety of uses are known to those skilled in the art to which the invention pertains.

Manufacture of the chassis entails design and fabrication of the metalwork and other components, as well as assembly. Such design and assembly would be readily ascertainable by those skilled in the art to which this invention pertains in view of the disclosure herein.

Finally, it must be understood that although the illustrated embodiment shows two different backplanes, it is possible to use more than two backplanes in the same manner, i.e., placed the backplanes alongside one another in a common chassis and orient them in a common axis, i.e., in a position in which they are adapted to receive three or different types of functional modules when inserted from a common side of the chassis. It is possible to provide a chassis with two backplanes of the same type with one backplane of a different type interposed between them. Other configurations, combinations and permutations of different backplanes may be used in the invention without deviating from the scope and spirit thereof.

A general concept of one embodiment of the invention is therefore the provision of a common chassis with the capability of receiving two or more different types of functional modules arising from the presence of two or more backplanes. This concept may be embodied in a variety of different ways, as disclosed herein and as would be derivable from the teachings herein to those skilled in the art to which the invention pertains. All such disclosed and derivable embodiments are considered to be encompassed within the scope of the claims, to the extent possible.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and is not limiting. The invention is limited only as defined in the claims and equivalents thereto.

The invention claimed is:

1. A chassis for an automated test system, comprising:
a housing defining an interior chassis space, said housing including an opening along one side leading into said interior chassis space;
at least a first backplane and a second backplane in said housing,
said first backplane having electrical connections on an engagement side for at least one functional module of a first type when at least partly present in said interior chassis space and engaged with said first backplane,
said second backplane having electrical connections on an engagement side for at least one functional module of a second type different than the first type when at least partly present in said interior chassis space and engaged with said second backplane,
said engagement sides of said first and second backplanes facing in the same direction toward said opening such that module-engaging portions of said electrical connections of said first and second backplanes are oriented toward said opening and the functional modules are insertable through said opening into engagement with said electrical connections on said engagement side of each of said first and second backplanes to thereby define an insertion direction for the functional modules,
said first backplane including electrical circuitry to enable signals to be provided for the first type of functional modules when engaged therewith,
said second backplane including electrical circuitry to enable signals to be provided for the second type of functional modules when engaged therewith; and
a support structure arranged in said interior chassis space,
said support structure supporting said second backplane a distance in front of and along one lateral edge of said first backplane such that said second backplane is supported at a depth into said interior chassis space in the insertion direction which is smaller than a depth of said first backplane into said interior chassis space in the insertion direction to cause said electrical connections on said engagement side of said second backplane to be closer to said opening than said electrical connections on said engagement side of said first backplane and all of said electrical connections on said engagement side of both of said first and second backplanes to be exposed to said opening simultaneously, said support structure comprising a support wall, said support wall extending beyond said first backplane in a direction toward said opening, said support wall being interposed between said first backplane and said second backplane such that all of said electrical connections of said first backplane are situated on one side of said support wall and all of said electrical connections of said second backplane are situated on an opposite side of said support wall.

2. The chassis of claim 1, wherein said support wall has a common height with said first backplane and said second backplane.

3. The chassis of claim 1, wherein said first backplane further comprises a first controller and said second backplane further comprises a second controller, said first controller being connected by said electrical circuitry in said first backplane to said housing and said second controller being connected by said electrical circuitry in said second backplane to said housing such that said first and second controllers are separately connected by electrical circuitry to said housing.

4. The chassis of claim 1, wherein each of said first and second backplanes is configured to source all voltages required by any functional modules engaging therewith separate from sourcing of all voltages required by any functional modules engaging with the other of said first and second backplanes.

5. The chassis of claim 1, wherein said first backplane is a VXI backplane and said second backplane is a PXI backplane.

6. The chassis of claim 1, further comprising a respective securing arrangement that secures each of the first and second types of functional modules to said housing, said respective securing arrangement comprising an upper extrusion arranged on said housing in a position above said first and second backplanes and a lower extrusion arranged on said housing in a position below said first and second backplanes.

7. The chassis of claim 1, further comprising a common DC power source that provides power through said electrical circuitry of said first and second backplanes to both types of functional modules when engaged with said first or second backplane, said power source being separately connected to said first backplane and to said second backplane such that said power source supplies power at specified voltage to said first backplane independent of power at specified voltage supplied to said second backplane.

8. The chassis of claim 1, wherein said electrical circuitry of said first and second backplanes is configured to allow for trigger signals to pass between the first and second types of functional modules when engaged with said first or second backplane and to allow for clock signals to pass between the first and second types of functional modules when engaged with said first or second backplane in a user-controllable or user-selectable manner.

9. The chassis of claim 1, wherein said electrical circuitry of said first and second backplanes is configured to provide signal conditioning or level translation of auxiliary signals passing between the first and second types of functional modules when engaged with said first or second backplane in a user-controllable or user-selectable manner.

10. The chassis of claim 1, wherein a bottom of said housing includes ducts to enable cooling of both types of functional modules when engaged with said first or second backplane.

11. The chassis of claim 1, further comprising a divider arranged at said opening in front of said second backplane to guide insertion of functional modules above and below said divider into engagement with said module-engaging portions of said electrical connections of said second backplane.

12. The chassis of claim 1, further comprising card guides arranged on said housing to guide insertion in the insertion direction of the functional modules from said opening into engagement with said electrical connections on said engagement side of each of said first and second backplanes.

13. The chassis of claim 1, wherein said at least one support is configured to position said electrical connections of said second backplane a distance from said first backplane such that when respective functional modules engage with said electrical connections of both said first and second backplanes, front ends of the respective functional modules are in a substantially common plane.

14. The chassis of claim 1, wherein said first backplane includes electrical connections only for functional modules of the first type and said second backplane includes electrical connections only for functional module of the second type.

15. A chassis for an automated test system, comprising: a housing defining an interior chassis space, said housing including an opening along one side leading into said interior chassis space; a plurality of different backplanes in said housing all oriented in a common axis and situated alongside one another, each of said backplanes having electrical connectors on an engagement side for a plurality of one distinct type of functional modules when at least partly present in said interior chassis space and engaged with said connectors, said engagement sides of said backplanes facing in the same direction toward said opening such that module-engaging portions of said connectors of said backplanes are oriented toward said opening and the functional modules are insertable through said opening into engagement with said connectors on said engagement side of each of said backplanes to thereby define an insertion direction for the functional modules, each of said backplanes including electrical circuitry to enable signals to be provided simultaneously for all of the functional modules when engaged with said connectors of said backplane; and a support structure arranged in said interior chassis space, said support structure supporting a first one of said backplanes a distance in front of and along one lateral edge of a second one of said backplanes such that said first backplane is supported at a depth into said interior chassis space in the insertion direction which is smaller than a depth of said second backplane into said interior chassis space in the insertion direction to cause said connectors of said first backplane to be closer to said opening than said connectors of said second backplane and all of said connectors of both of said first and second backplanes to be exposed to said opening simultaneously, said support structure comprising a support wall, said support wall extending beyond said second backplane in a direction toward said opening, said support wall being interposed between said first backplane and said second backplane such that all of said connectors of said first backplane are situated on one side of said support wall and all of said connectors of said second backplane are situated on an opposite side of said support wall, said connectors on said first backplane being configured to engage only with functional modules of a first type and said connectors on said second backplane being configured to engage only with functional modules of a second type different than the first type.

16. The chassis of claim 15, further comprising a cooling system configured to satisfy cooling requirements of the different types of functional modules when engaged with said connectors.

17. The chassis of claim 15, wherein each of said backplanes further comprises common signal lines additional to a minimum number of signal lines needed to support all of the functional modules, and each of said backplanes is configured to provide an address bus, a data bus, a trigger bus, an interrupt bus, a local bus, clock and power signals and slot identification signals separate from an address bus, a data bus, a trigger bus, an interrupt bus, a local bus, clock and power signals and slot identification signals provided by another of said backplanes and to source all voltages required by the functional modules separate from sourcing of voltages required by the functional modules of another of said backplanes.

18. The chassis of claim 15, further comprising card guides arranged on said housing to guide insertion of the functional modules from said opening into engagement with said connectors on said engagement side of each of said backplanes.

19. The chassis of claim 15, further comprising an upper extrusion arranged on said housing in a position above said backplanes and a lower extrusion arranged on said housing in a position below said backplanes, said upper and lower extrusions securing each of the types of functional modules to said housing.

20. The chassis of claim 15, wherein said first backplane further comprises a first controller and said second backplane further comprises a second controller, said first controller being connected by said electrical circuitry in said first backplane to said housing and said second controller being connected by said electrical circuitry in said second backplane to said housing such that said first and second controllers are separately connected by electrical circuitry to said housing.

* * * * *